United States Patent
Huang et al.

(10) Patent No.: US 6,583,491 B1
(45) Date of Patent: Jun. 24, 2003

(54) MICROELECTRONIC FABRICATION HAVING MICROELECTRONIC CAPACITOR STRUCTURE FABRICATED THEREIN

(75) Inventors: Chi-Feng Huang, Pingtung (TW); Chun-Hon Chen, Hsin-Chu (TW)

(73) Assignee: Taiwan Semiconductor Manufacturing Co., Ltd, Hsin (TW)

( * ) Notice: Subject to any disclaimer, the term of this patent is extended or adjusted under 35 U.S.C. 154(b) by 0 days.

(21) Appl. No.: 10/143,162

(22) Filed: May 9, 2002

(51) Int. Cl.[7] ................. H01L 29/00; H01L 27/108
(52) U.S. Cl. .................................. 257/532; 257/311
(58) Field of Search ........................ 257/306, 311, 257/298, 532; 438/239, 253, 396

(56) References Cited

U.S. PATENT DOCUMENTS

| | | | |
|---|---|---|---|
| 6,198,617 B1 | 3/2001 | Sun | 361/301.4 |
| 6,200,682 B1 | 3/2001 | Chen | 257/758 |
| 6,232,197 B1 | 5/2001 | Tsai | 438/393 |
| 6,259,128 B1 | 7/2001 | Adler et al. | 257/301 |
| 6,391,713 B1 * | 5/2002 | Hsue et al. | 438/253 |
| 6,410,386 B1 * | 6/2002 | Hsue et al. | 438/253 |
| 6,466,427 B1 * | 10/2002 | Chen | 361/306.3 |
| 6,486,531 B2 * | 11/2002 | Oh | 257/532 |
| 6,501,120 B1 * | 12/2002 | Tu et al. | 257/306 |
| 6,504,205 B1 * | 1/2003 | Hsue et al. | 257/306 |
| 2002/0192898 A1 * | 12/2002 | Kraus et al. | 438/239 |

* cited by examiner

Primary Examiner—George Eckert
(74) Attorney, Agent, or Firm—Tung & Associates

(57) ABSTRACT

Within a method for fabricating a microelectronic fabrication, and the microelectronic fabrication fabricated employing the method, there is formed within the microelectronic fabrication a capacitor structure upon a conductor stud layer formed into a first via defined by a patterned dielectric layer to reach a one of a pair of patterned conductor layers within the microelectronic fabrication prior to forming through the patterned dielectric layer a second via to reach the other of the pair of patterned conductor layers within the microelectronic fabrication. The method provides the resulting microelectronic fabrication with enhanced reliability and performance.

5 Claims, 2 Drawing Sheets

MICROELECTRONIC FABRICATION HAVING MICROELECTRONIC CAPACITOR STRUCTURE FABRICATED THEREIN

CROSS-REFERENCE TO RELATED APPLICATION

This application is related to co-assigned application Ser. No. 10/170,840, filed Jun. 13, 2002, titled "Microelectronic Fabrication Having Sidewall Passivated Microelectronic Capacitor Structure Fabricated Therein."

BACKGROUND OF THE INVENTION

1. Field of the Invention

The present invention relates generally to microelectronic fabrications. More particularly, the present invention relates to microelectronic fabrications having microelectronic capacitor structures fabricated therein.

2. Description of the Related Art

Microelectronic fabrications are formed from microelectronic substrates over which are formed patterned microelectronic conductor layers which are separated by microelectronic dielectric layers.

In addition to the fabrication of transistor structures, resistor structures and diode structures within microelectronic fabrications, it is also common in the art of microelectronic fabrication to fabricate capacitor structures within microelectronic fabrications. Capacitor structures within microelectronic fabrications are employed within microelectronic fabrications including but not limited to: (1) data storage and retrieval microelectronic fabrications (such as semiconductor integrated circuit memory microelectronic fabrications); and (2) signal processing microelectronic fabrications (such as semiconductor integrated circuit mixed signal (i.e., integrated digital and analog signal) microelectronic fabrications and semiconductor integrated circuit logic microelectronic fabrications).

While capacitor structures are thus clearly desirable in the art of microelectronic fabrication and often essential in the art of microelectronic fabrication, capacitor structures are nonetheless not entirely without problems in the art of microelectronic fabrication.

In that regard, it is often difficult in the art of microelectronic fabrication to fabricate, with enhanced reliability and performance, microelectronic fabrications having formed therein capacitor structures.

It is thus desirable in the art of microelectronic fabrication to fabricate, with enhanced reliability and performance, microelectronic fabrications having formed therein capacitor structures.

It is towards the foregoing object that the present invention is directed.

Various capacitor structures having desirable properties, and methods for fabrication thereof, have been disclosed in the art of microelectronic fabrication.

Included among the capacitor structures and methods for fabrication thereof, but not limited among the capacitor structures and methods for fabrication thereof, are capacitor structures and methods for fabrication thereof disclosed within: (1) Sun, in U.S. Pat. No. 6,198,617 (a capacitor structure having enhanced performance incident to being formed as a metal-insulator-metal (MIM) capacitor structure with a first metal plate layer formed of an electromigration resistant material); (2) Tsai, in U.S. Pat. No. 6,232,197 (a capacitor structure having enhanced performance incident to being fabricated in part employing a damascene method); (3) Adler et al., in U.S. Pat. No. 6,259,128 (a metal-insulator-metal (MIM) capacitor structure formed with enhanced performance incident to being formed employing multiple barrier layers); and (4) Chen, in U.S. Pat. No. 6,300,682 (a capacitor structure having enhanced performance incident to being formed with a guard ring encircling an upper capacitor electrode plate within the capacitor structure).

Desirable in the art of microelectronic fabrication are additional microelectronic fabrications with enhanced reliability and performance, as fabricated having formed therein capacitor structures.

It is towards the foregoing object that the present invention is directed.

SUMMARY OF THE INVENTION

A first object of the present invention is to provide a microelectronic fabrication having formed therein a capacitor structure and a method for fabricating the microelectronic fabrication having formed therein the capacitor structure.

A second object of the present invention is to provide the microelectronic fabrication and the method for fabricating the microelectronic fabrication in accord with the first object of the present invention, wherein the microelectronic fabrication is fabricated with enhanced reliability and performance.

In accord with the objects of the present invention, there is provided by the present invention a microelectronic fabrication and a method for fabricating the microelectronic fabrication.

To practice the method of the present invention, there is first provided a substrate. There is then formed over the substrate a first dielectric layer having formed exposed therein a pair of patterned first conductor layers. There is then formed over the first dielectric layer including the pair of patterned first conductor layers a blanket second dielectric layer. There is then patterned the blanket second dielectric layer to form a patterned second dielectric layer which defines a first via which accesses one of the pair of patterned first conductor layers but not the other of the pair of patterned first conductor layers. There is then formed into the first via a first conductor interconnect stud layer. There is then formed contacting the first conductor interconnect stud layer and over the patterned second dielectric layer a capacitor structure. There is then patterned additionally, after having formed the capacitor structure, the patterned second dielectric layer to form a twice patterned second dielectric layer which defines a second via which accesses the other of the pair of patterned first conductor layers. Finally, there is then formed into the second via a second conductor interconnect stud layer.

There is provided by the present invention a microelectronic fabrication having formed therein a capacitor structure and a method for fabricating the microelectronic fabrication having formed therein the capacitor structure, wherein the microelectronic fabrication is fabricated with enhanced reliability and performance.

The present invention realizes the foregoing object by forming the capacitor structure within the microelectronic fabrication upon a conductor interconnect stud layer formed into a first via defined by a patterned second dielectric layer to access one of a pair of patterned first conductor layers formed within a first dielectric layer formed beneath the patterned second dielectric layer, prior to forming through the patterned second dielectric layer a second via to access the other of the pair of patterned first conductor layers.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

There is provided by the present invention a microelectronic fabrication having formed therein a capacitor structure, and a method for fabricating the microelectronic fabrication having formed therein the capacitor structure, wherein the microelectronic fabrication is fabricated with enhanced reliability and performance.

The present invention realizes the foregoing object by forming the capacitor structure within the microelectronic fabrication upon a conductor interconnect stud layer formed into a first via defined by a patterned second dielectric layer to access one of a pair of patterned first conductor layers formed exposed within a first dielectric layer formed beneath the patterned second dielectric layer, prior to forming through the patterned second dielectric layer a second via to reach the other of the pair of patterned first conductor layers.

While the preferred embodiment of the present invention provides particular value within the context of fabricating, with enhanced reliability and enhanced performance, a semiconductor integrated circuit microelectronic fabrication having formed therein a metal-insulator-metal (MIM) capacitor structure, the present invention is not intended to be so limited. Rather, the present invention may be employed for fabricating, with enhanced performance and enhanced reliability, microelectronic fabrications having formed therein capacitor structures, where the microelectronic fabrications include but are not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications. Similarly, the present invention may be practiced within the context of the foregoing microelectronic fabrications when having formed therein capacitor structures including but not limited to planar capacitor structure and topographic capacitor structures.

Referring now to FIG. 1 to FIG. 5, there is shown a series of schematic cross-sectional diagrams illustrating the results of progressive stages in fabricating, in accord with a preferred embodiment of the present invention, a microelectronic fabrication having formed therein a capacitor structure.

Figure 1:
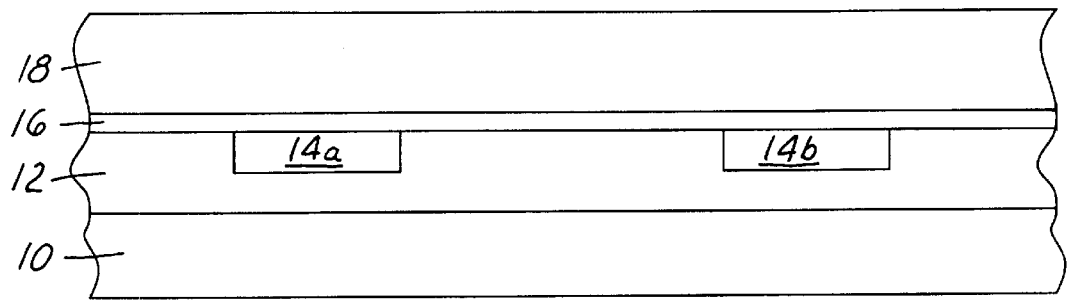
FIG. 1, FIG. 2, FIG. 3, FIG. 4 and FIG. 5 show a series of schematic cross-sectional diagrams illustrating the results of progressive stages in fabricating, in accord with a preferred embodiment of the present invention, a microelectronic fabrication having formed therein a capacitor structure.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed thereupon a first dielectric layer 12 in turn having formed and exposed therein at an identical or nominally equivalent topographic height a pair of patterned first conductor layers 14a and 14b. As is illustrated in FIG. 1, a series of upper surfaces of the first dielectric layer 12 and the pair of patterned first conductor layers 14a and 14b is planar.

Within the preferred embodiment of the present invention with respect to the substrate 10, and in accord with the above, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in an alternative, the substrate 10 may comprise a substrate as employed within the microelectronic fabrication, where the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

In addition, and although also not specifically illustrated within the schematic cross-sectional diagram of FIG. 1, the substrate 10, typically and preferably, but not exclusively, when the substrate 10 consists of or comprises a semiconductor substrate as employed within a semiconductor integrated circuit microelectronic fabrication, has formed therein microelectronic structures (which may correspond with microelectronic devices) as are otherwise conventional within the microelectronic fabrication within which is employed the substrate 10. Such microelectronic structures may include, but are not limited to transistor structures, resistor structures, diode structures and capacitor structures (in addition to the capacitor structures formed in accord with the present invention).

Most typically and preferably, within the preferred embodiment of the present invention, the substrate 10 consists of or comprises a semiconductor substrate as employed within a semiconductor integrated circuit microelectronic fabrication, and the semiconductor substrate has formed therein, thereupon and/or thereover microelectronic structures such as semiconductor microelectronic device structures.

Within the preferred embodiment of the present invention with respect to the first dielectric layer 12, the first dielectric layer 12 may be formed from any of several dielectric materials as are conventional in the art of microelectronic fabrication, but will typically and preferably generally be formed of a higher temperature resistant dielectric material, such as but not limited to a silicon oxide dielectric material, a silicon nitride dielectric material or a silicon oxynitride dielectric material. Typically and preferably, the first dielectric layer 12 is formed to a thickness of from about 3000 to about 5000 angstroms upon the substrate 10.

Within the preferred embodiment of the present invention with respect to the pair of first patterned conductor layers 14a and 14b, the pair of patterned first conductor layers 14a and 14b may be formed of conductor materials as are conventional in the art of microelectronic fabrication, such as but not limited to metal, metal alloy, doped polysilicon (having a dopant concentration of greater than about 1E20 dopant atoms per cubic centimeter) and polycide (doped polysilicon/metal silicide stack) conductor materials, although copper and copper alloy conductor materials with appropriate barrier materials are preferred. Typically and preferably, each of the pair of patterned first conductor layers 14a and 14b is formed to a thickness of from about 3000 to about 8000 angstroms and a linewidth of from about 3 $\mu$m to about 30 $\mu$m microns and exposed at the identical or nominally equivalent topographic level within the first dielectric layer 12.

There is also shown within the schematic cross-sectional diagram of FIG. 1, and formed upon exposed portions of the first dielectric layer 12 and the pair of patterned first conductor layers 14a and 14b, a pair of blanket layers comprising: (1) an optional blanket first barrier layer 16 formed upon exposed portions of the first dielectric layer 12 and the pair of patterned first conductor layers 14a and 14b; and (2) a blanket second dielectric layer 18 formed upon the blanket first barrier layer 16.

Within the preferred embodiment of the present invention with respect to the optional blanket first barrier layer 16, the optional blanket first barrier layer 16 is formed of a barrier material as is otherwise generally conventional in the art of microelectronic fabrication. For example and without limitation, under circumstances where the pair of patterned first conductor layers 14a and 14b is formed at least in part of a copper containing conductor material with an appropriate barrier material, the optional blanket first barrier layer 16 may be formed of a silicon nitride dielectric barrier material which inhibits interdiffusion of a copper containing conductor material with a dielectric material from which is formed the blanket second dielectric layer 18. Typically and preferably, the blanket first barrier layer 16 is formed to a thickness of from about 300 to about 700 angstroms upon exposed portions of the first dielectric layer 12 and the pair of patterned first conductor layers 14a and 14b.

Within the preferred embodiment of the present invention with respect to the blanket second dielectric layer 18, the blanket second dielectric layer 18 may typically and preferably be formed of a dielectric material analogous or equivalent to the dielectric material from which is formed the first dielectric layer 12, although such is not required within the present invention. Typically and preferably, the blanket second dielectric layer 18 is formed to a thickness of from about 6000 to about 8000 angstroms upon the optional blanket first barrier layer 16.

Figure 2:
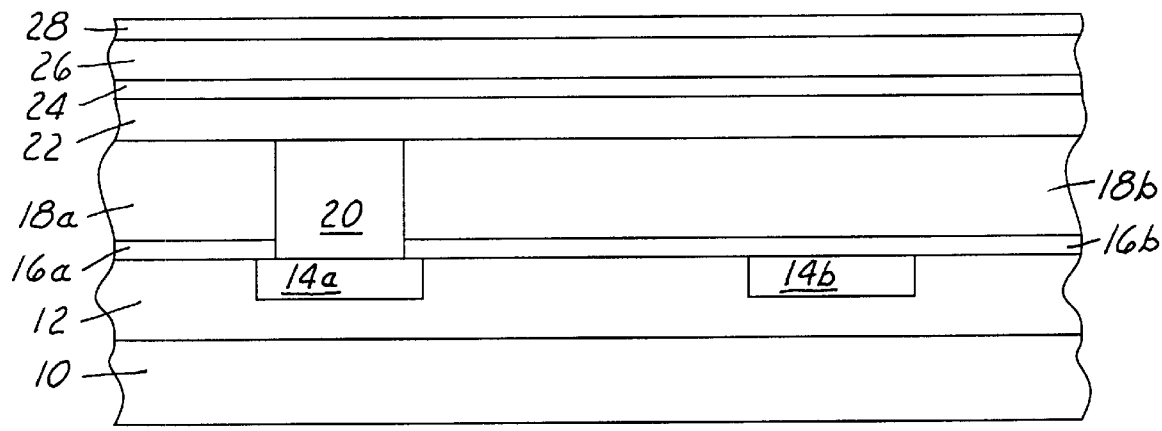

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise identical to the microelectronic fabrication whose schematic cross-sectional diagram is illustrated in FIG. 1, but wherein the blanket second dielectric layer 18 and the optional blanket first barrier layer 16 have been patterned to form a corresponding pair of patterned second dielectric layers 18a and 18b and a corresponding pair of patterned first barrier layers 16a and 16b, which in an aggregate form a first via which accesses the patterned first conductor layer 14a. As is illustrated within the schematic cross-sectional diagram of FIG. 2, there is formed through the blanket second dielectric layer 18 and the blanket first barrier layer 16 the first via which accesses the patterned first conductor layer 14a, but there is not formed an additional first via through the blanket second dielectric layer 18 and blanket first barrier layer 16 such as to access the patterned first conductor layer 14b. Similarly, there is also shown within the schematic cross-sectional diagram of FIG. 2 a first conductor interconnect stud layer 20 formed into the first via.

Within the preferred embodiment of the present invention, the patterning of the blanket second dielectric layer 18 and the blanket first barrier layer 16 to form the corresponding pair of patterned second dielectric layers 18a and 18b (which are intended in plan view as representative of a contiguous patterned second dielectric layer) and the corresponding pair of patterned first barrier layers 16a and 16b (which are intended in plan view as representative of a contiguous patterned first barrier layer) may be effected while employing masked etch methods, such as but not limited to photoresist masked plasma etch methods, as are otherwise generally conventional in the art of microelectronic fabrication. Similarly, within the preferred embodiment of the present invention with respect to the first conductor interconnect stud layer 20, the first conductor interconnect stud layer 20 may be formed employing methods and materials as are otherwise generally conventional in the art of microelectronic fabrication, such as but not limited to chemical mechanical polish (CMP) planarizing methods, to form the first conductor interconnect stud layer 20 of conductor materials including but not limited to metal, metal alloy, doped polysilicon and polycide conductor materials, but most particularly copper metal and copper metal alloy conductor materials (which will generally also include conductor barrier material liner layers or dielectric barrier material liner layers).

Finally, there is also shown within the schematic cross-sectional diagram of FIG. 2, and formed upon exposed portions of the pair of patterned second dielectric layers 18a and 18b and the first conductor interconnect stud layer 20 a series of four blanket layers. The series of four blanket layers comprises: (1) a blanket first capacitor plate layer 22 formed upon exposed portions of the pair of patterned second dielectric layers 18a and 18b and the first conductor interconnect stud layer 20; (2) a blanket capacitor dielectric layer 24 formed upon the blanket first capacitor plate layer 22; (3) a blanket second capacitor plate layer 26 formed upon the blanket capacitor dielectric layer 24; and (4) an optional blanket second barrier layer 28 formed upon the blanket second capacitor plate layer 26.

Within the preferred embodiment of the present invention with respect to the blanket first capacitor plate layer 22 and the blanket second capacitor plate layer 26, each of the blanket first capacitor plate layer 22 and the blanket second capacitor plate layer 26 may be formed employing methods and materials as are conventional in the art of microelectronic fabrication, although in accord with the related art references cited within the Description of the Related Art, the disclosures of which are incorporated herein fully by reference, each of the blanket first capacitor plate layer 22 and the blanket second capacitor plate layer 26 is formed of a metal or metal alloy material which is not susceptible to a depletion phenomenon, as is common with polysilicon capacitor plate layer materials, in order to provide enhanced performance of a capacitor structure fabricated from the blanket first capacitor plate layer 22 and the blanket second capacitor plate layer 26. Typically and preferably, each of the blanket first capacitor plate layer 22 and the blanket second capacitor plate layer 26 is formed of a refractory metal or a refractory metal alloy formed to a thickness of from about 400 to about 600 angstroms. Most typically and preferably, each of the blanket first capacitor plate layer 22 and the blanket second capacitor plate layer 26 is formed of a copper diffusion barrier metal or metal alloy.

Within the preferred embodiment of the present invention with respect to the blanket capacitor dielectric layer 24, the blanket capacitor dielectric layer 24 may also be formed of capacitor dielectric materials as are conventional in the art of microelectronic fabrication, including but not limited to generally lower dielectric constant capacitor dielectric materials (i.e., having dielectric constants or less than about 10), such as but not limited to silicon oxide dielectric materials, silicon nitride dielectric materials and silicon oxynitride dielectric materials, as well as generally higher dielectric constant capacitor dielectric materials (i.e., having dielectric constants of greater than about 10 and more typically and preferably of greater than about 50, such as but not limited to tantalum oxide dielectric materials, lead zirconate titanate (PZT) dielectric materials and barium strontium titanate (BST) dielectric materials (with tantalum oxide dielectric mateirals being particularly preferred). Typically and preferably, the blanket capacitor dielectric layer 24 is formed to a thickness of from about 300 to about 500 angstroms upon the blanket first capacitor plate layer 22.

As is understood by a person skilled in the art, the optional blanket second barrier layer 28 is employed within the present invention generally under circumstances where the blanket capacitor dielectric layer 24 is formed of a generally higher dielectric constant dielectric material which requires a thermal annealing to fully develop and stabilize the generally higher dielectric constant of the generally higher dielectric constant dielectric material. Under such circumstance, the optional blanket second barrier layer 28 provides a diffusion barrier layer for diffusion of species, such as oxidant species, which might otherwise compromise integrity of the blanket first capacitor plate layer 22 and the blanket second capacitor plate layer 26 when thermally annealing the microelectronic fabrication whose schematic cross-sectional diagram is illustrated in FIG. 2.

As is also understood by a person skilled in the art, and within the context of the present invention and preferred embodiment of the present invention, by employing the pair of patterned second dielectric layers 18a and 18b which are initially patterned to access only the patterned first conductor layer 14a but not the patterned first conductor layer 14b, there is provided within the context of the present invention and the preferred embodiment of the present invention additional barrier properties with respect to the first patterned conductor layer 14b when forming a microelectronic fabrication having formed therein a capacitor structure in accord with the present invention and the preferred embodiment of the present invention.

Figure 3:
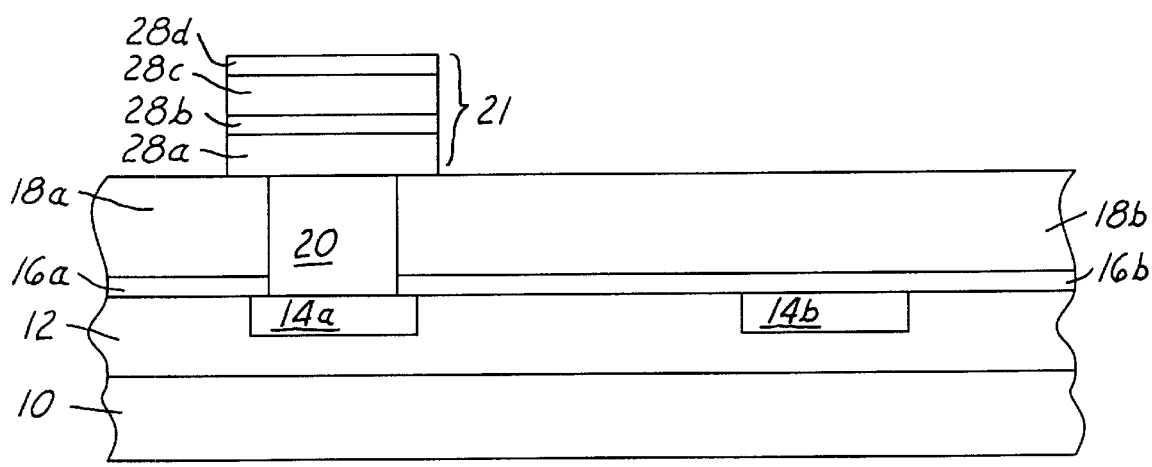

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise identical to the microelectronic fabrication whose schematic cross-sectional diagram is illustrated in FIG. 2, but wherein the optional blanket second barrier layer 28, the blanket second capacitor plate layer 26, the blanket capacitor dielectric layer 24 and the blanket first capacitor plate layer 22 have been successively patterned to form therefrom a corresponding optional patterned second barrier layer 28a aligned upon a corresponding patterned second capacitor plate layer 26a, in turn aligned upon a corresponding patterned capacitor dielectric layer 24a, in turn aligned upon a corresponding patterned first capacitor plate layer 22a, which in an aggregate comprise a capacitor structure 21 contacting and wider than the first conductor interconnect stud layer 20, and spanning over the pair of patterned second dielectric layers 18a and 18b.

Within the preferred embodiment of the present invention, the foregoing series of four blanket layers may be patterned to form the capacitor structure 21 as illustrated within the schematic cross-sectional diagram of FIG. 3 while employing photolithographic masking and etch methods as are conventional in the art of microelectronic fabrication.

Figure 4:
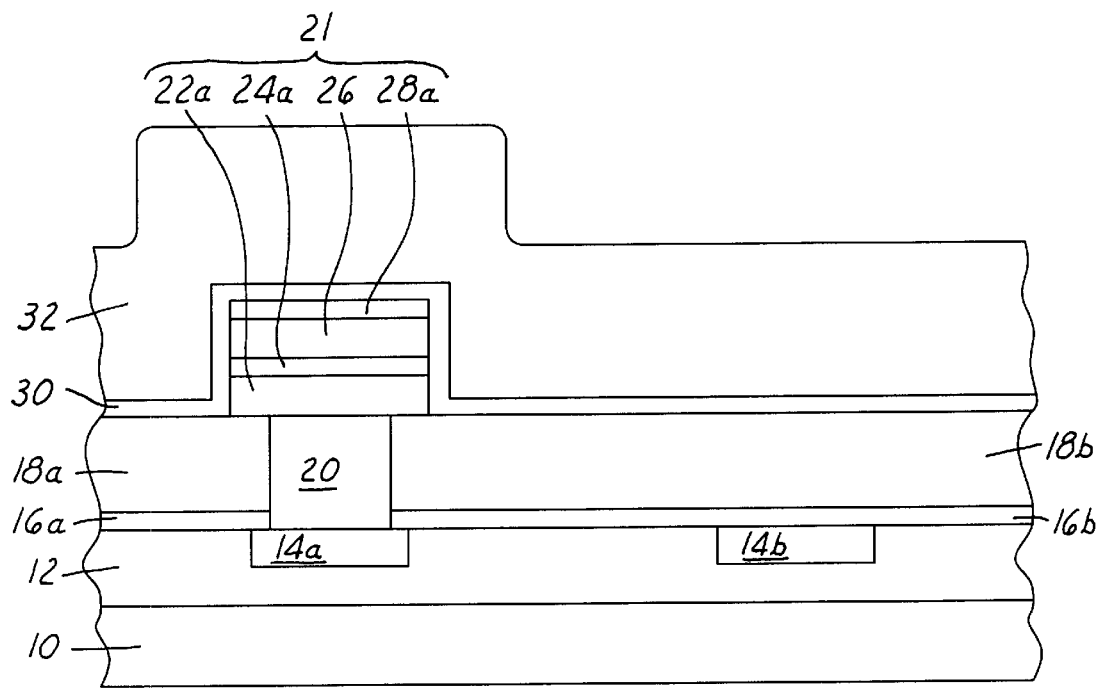

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise identical to the microelectronic fabrication whose schematic cross-sectional diagram is illustrated in FIG. 3, but wherein there is formed upon exposed portions of the pair of patterned second dielectric layers 18a and 18b and the capacitor structure 21 an optional blanket third barrier layer 30, and there is formed upon the optional blanket third barrier layer 30 a blanket third dielectric layer 32.

Within the preferred embodiment of the present invention with respect to the optional blanket third barrier layer 30, the optional blanket third barrier layer 30 is typically and preferably formed employing methods, materials and thickness dimensions analogous or equivalent to the methods, materials and thickness dimensions employed for forming the optional blanket first barrier layer 16 as illustrated within the schematic cross-sectional diagram of FIG. 1. Similarly, within the preferred embodiment of the present invention with respect to the blanket third dielectric layer 32, the blanket third dielectric layer 32 may be formed employing methods, materials and thickness dimensions analogous or equivalent to the methods, materials and thickness dimensions employed for forming the blanket second dielectric layer 18 as illustrated within the schematic cross-sectional diagram of FIG. 1.

Figure 5:
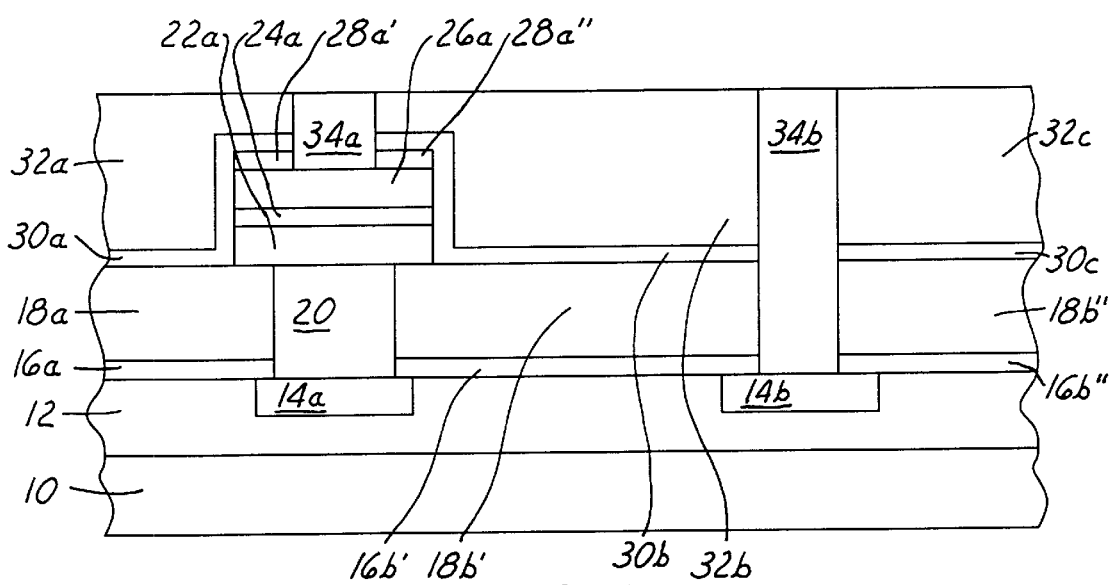

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise identical to the microelectronic fabrication whose schematic cross-sectional diagram is illustrated in FIG. 4, but wherein, in a first instance, the blanket third dielectric layer 32 has been planarized to form a planarized blanket third dielectric layer which is not otherwise shown. Such planarization may be effected while employing methods and materials, and in particular chemical mechanical polish (CMP) planarizing methods and materials, as are common in the art of microelectronic fabrication.

Similarly, there is also shown within the schematic cross-sectional diagram of FIG. 5 the results of patterning: (1) the planarized blanket third dielectric layer; (2) the blanket third barrier layer 30; (3) the patterned second barrier layer 28a; (4) the patterned second dielectric layer 18b; and (5) the patterned first barrier layer 16b to form: (1) a corresponding series of patterned third dielectric layers 32a, 32b and 32c; (2) a corresponding series of patterned third barrier layers 30a, 30b and 30c; (3) a corresponding pair of twice patterned second barrier layers 28a' and 28a"; (4) a corresponding pair of twice patterned second dielectric layers 18b' and 18b"; and (5) a corresponding pair of twice patterned first barrier layers 16b' and 16b", the foregoing series of patterned layers in an aggregate forming a pair of second apertures, one accessing a portion of the patterned second capacitor plate layer 26a and the other accessing a portion of the patterned first conductor layer 14b. As is illustrated in FIG. 5, the latter of the pair of second apertures is formed completely through the multilayer dielectric layer to reach the patterned first conductor layer 14b.

Within the preferred embodiment of the present invention, the foregoing series of blanket and patterned layers may be patterned to form the foregoing series of patterned and twice patterned layers while employing photolithographic and etch methods as are conventional in the art of microelectronic fabrication.

Finally, there is shown within the schematic cross-sectional diagram of FIG. 5, and formed into the pair of second apertures, a pair of single layer second conductor interconnect stud layers 34a and 34b, one each reaching the corresponding patterned second capacitor plate layer 26a and the patterned first conductor layer 14b.

Upon forming the microelectronic fabrication whose schematic cross-sectional diagram is illustrated in FIG. 5, there is fabricated a microelectronic fabrication in accord with the preferred embodiment of the present invention, wherein the microelectronic fabrication is fabricated with enhanced reliability and performance while having formed therein a capacitor structure.

The present invention realizes the foregoing objects by forming the capacitor structure within the microelectronic fabrication upon a conductor stud layer formed into a first via defined by a patterned dielectric layer to reach a one of a pair of patterned conductor layers prior to forming through the patterned dielectric layer a second via to reach the other of the pair of patterned conductor layers.

As is understood by a person skilled in the art, the preferred embodiment of the present invention is illustrative of the present invention rather than limiting of the present invention. Revisions and modifications may be made to methods, materials, structures and dimensions employed in fabricating a microelectronic fabrication in accord with the preferred embodiment of the present invention, while still fabricating a microelectronic fabrication in accord with the present invention, further in accord with the accompanying claims.

What is claimed is:

1. A microelectronic fabrication comprising:
    a substrate;
    a first dielectric layer formed over the substrate, the first dielectric layer having formed exposed therein a pair of patterned first conductor layers such that a series of upper surfaces of the first dielectric layer and the pair of patterned first conductor layers is planar;
    a multilayer patterned dielectric layer formed over the first dielectric layer, the multilayer patterned dielectric layer having a capacitor structure formed interposed between a pair of dielectric layers within the multilayer dielectric layer, the capacitor structure being registered with respect to a first one of the pair of patterned conductor layers, the multilayer patterned dielectric layer having a first via interposed between the capacitor structure and the first one of the pair of patterned conductor layers and a second via formed completely through the multilayer dielectric layer to access a second of the pair of patterned conductor layers; and
    a first conductor contact stud layer formed within the first via and a single layer second conductor stud layer formed within the second via.

2. The microelectronic fabrication of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The microelectronic fabrication of claim 1 wherein the pair of patterned first conductor layers is formed at an identical topographic level within the first dielectric layer.

4. The microelectronic fabrication of claim 1 wherein the capacitor structure is selected from the group consisting of planar capacitor structures and topographic capacitor structures.

5. The microelectronic fabrication of claim 1 wherein the capacitor structure is a metal-insulator-metal capacitor structure.

* * * * *